US008735819B2

(12) United States Patent
Fendler et al.

(10) Patent No.: US 8,735,819 B2
(45) Date of Patent: May 27, 2014

(54) DETECTOR SYSTEM WITH AN OPTICAL FUNCTION AND METHOD FOR MAKING SUCH A SYSTEM

(75) Inventors: Manuel Fendler, Grenoble (FR); Gilles Lasfargues, Grenoble (FR); Francois Marion, Saint-Martin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 701 days.

(21) Appl. No.: 12/603,143

(22) Filed: Oct. 21, 2009

(65) Prior Publication Data

US 2010/0123899 A1 May 20, 2010

(30) Foreign Application Priority Data

Nov. 19, 2008 (FR) ..................................... 08 57856

(51) Int. Cl.
*G01J 5/00* (2006.01)
*G01J 5/02* (2006.01)
*G02B 6/42* (2006.01)

(52) U.S. Cl.
CPC ............. *G01J 5/0205* (2013.01); *G02B 6/4228* (2013.01); *G02B 6/4231* (2013.01)
USPC ....................................... 250/338.1; 356/400

(58) Field of Classification Search
CPC .... G02B 6/4202; G02B 6/236; G02B 6/4239; G02B 6/4231; G02B 6/4228
USPC ............. 250/336.1, 370.13, 338.1, 330, 332, 250/338.4, 340
See application file for complete search history.

(56) References Cited

U.S. PATENT DOCUMENTS

| | | | | |
|---|---|---|---|---|
| 4,041,314 | A * | 8/1977 | Oppelt | 250/352 |
| 5,574,285 | A | 11/1996 | Marion et al. | |
| 6,465,344 | B1 * | 10/2002 | Barton | 438/626 |
| 6,566,170 | B1 | 5/2003 | Marion et al. | |
| 6,942,396 | B2 * | 9/2005 | Marion et al. | 385/90 |

FOREIGN PATENT DOCUMENTS

| | | | |
|---|---|---|---|
| EP | 0662721 | A1 | 7/1995 |
| FR | 2780200 | A1 | 12/1999 |

OTHER PUBLICATIONS

International Search Report Jul. 8, 2009.

* cited by examiner

*Primary Examiner* — David Porta
*Assistant Examiner* — Yara B Green
(74) *Attorney, Agent, or Firm* — Pearne & Gordon LLP

(57) ABSTRACT

The invention relates to a system and method for positioning and passively aligning at least one optical component as close as possible to an electromagnetic radiation detector. This system comprises supporting wedges (37) for Z positioning of the optical component (35) as close as possible to the detector (21) and passive X and Y alignment means via holding wedges and/or holding balls (36), the X, Y and Z axes being axes perpendicular to each other.

15 Claims, 9 Drawing Sheets

DETECTOR SYSTEM WITH AN OPTICAL FUNCTION AND METHOD FOR MAKING SUCH A SYSTEM

TECHNICAL FIELD

The invention relates to a detector system with an optical function and a method for making the latter.

STATE OF THE PRIOR ART

The field of the invention is that of detectors of electromagnetic radiation, more particularly of cooled infrared detectors, and the positioning of at least one optical component, for example of a matrix of microlenses, a zoom system, etc., as close as possible to one of these detectors, for example at a distance from 0 to a few hundred micrometers.

Cooled Infrared Detectors

A cooled infrared (IR) detector may be obtained by associating a material sensitive to infrared radiations, which transforms the received photons into electrons, and a readout circuit which allows processing of these electrons in order to form an image. The quality of the images provided by such a detector depends on the number of pixels which make it up and on the environment in which it is found. The number of pixels is determined by the number of electric connections between the photosensitive material and the readout circuit. Present infrared detectors may include about hundred thousand pixels with a pitch from 10 to 50 μm for an active surface of 1 to 2 $cm^2$.

In order to reduce the noise in a detector, the latter may be confined in a cryostat in vacuo, for example at a temperature of 77 Kelvin (about −200° C.) The cryostats and their cooling systems determine the size of the infrared detection systems. In a sectional view of an infrared detector 10 in its cryostat, illustrated in FIG. 1, are thus illustrated:

- the detector 10 of infrared radiation 13,
- the vacuum chamber 11 of the cryostat, of length $l_1$ (10 cm<$l_1$<20 cm),
- a system 12 for cooling the detector of length $l_2$ (10 cm<$l_2$<20 cm).

A cooled infrared detector is obtained by applying a so-called ball hybridization technique, called a "flip chip" technique, and described in the document referenced as [1] at the end of the description. This hybridization technique, illustrated in FIG. 2, allows a readout circuit 20 and a detector portion or detector 21 to be mechanically and electrically connected, by means of hybridization balls 23, further called electric connection balls, the height of which is of the order of 10 μm for a present detector with a pitch of 30 μm and it increases with the pitch of the pixels.

The detector portion 21 may consist of two materials ("homo-substrate") in order to form a substrate 25 (about 500 μm) and an active portion 26 (about 10 μm) as illustrated in FIG. 3B, or of three materials ("hetero-substrate") in order to form a substrate 27 (about 500 μm), an intermediate substrate 28 (from a few μm to a few 10 μm) and an active portion 29 (about 10 μm) as illustrated in FIG. 3A. The state of the art as regards infrared radiation detectors on a CdZnTe or CdTe substrate is described in the document referenced as [2]. In the following, homo-substrate detectors are considered as an example. However, both types of detectors are possible.

Thus, in the field of detection of infrared radiations, the detectors have to operate at low temperatures in order to minimize the background noises which are superimposed to the signal to be detected. In order to minimize the risks of mechanical and electrical failure of the connection balls 23 during the cooling of the detector, a technique from the prior art consists of placing an underfill 31 between the readout circuit 20 and the detector portion 21, for example by depositing epoxy drops on the readout circuit so that the underfill penetrates between the balls 23 and fills in the space between the readout circuit 20 and the detector portion 21. The placement of this underfill may be accomplished before or after hybridization of the components, as described in the document referenced as [3]. In both cases, the materials used for the underfill move up by capillarity on the sides of the detector portion 21, as illustrated in FIG. 4, and generate a protruding rim 30. More specifically, such a protruding rim 30 is formed when the filling material covers the side edges of the active portion. The height over which the underfill moves up, which is of the order of 200 μm, may be increased or decreased. Two possible detector configurations are thereby obtained: with or without any protruding rim, as illustrated in FIGS. 5A and 5B, respectively.

These techniques for placing an underfill for minimizing the risks of failures of the balls 23 may be associated with the thinning of the detector portion 21 which may be carried out chemically by selective chemistry on the different substrates, or mechanically by polishing. Depending on the selected underfill configuration, with or without a protruding rim, two possible detector forms are obtained after such thinning, as illustrated in FIGS. 6A and 6B. For mechanical reasons of pressure from the protruding rim on the detector, the configuration which is the most used today is that without any protruding rim, illustrated in FIG. 6B. This figure therefore illustrates the state of the art for cooled infrared detectors.

Optical Components

The optical components used, for example a lens, zoom, etc., are developed by equipment manufacturers in order to obtain multifunctional infrared detectors. These components placed outside the cryostat, increase the size of the complete system formed by the cryostat, the cooling system and the optical components, as well as its weight.

FIG. 7 thus illustrates a detector with an optical function from the prior art, comprising an optical block 40 of length $l_3$, a cryostat 41 of length $l_4$, a detector 42 of the type illustrated in FIG. 6B, a cooling system 42 of length $l_5$.

Conventionally one has:

$0<l_3<30$ cm

~10 cm<$l_4$<20 cm

~10 cm<$l_5$<20 cm

Given the miniaturization of the optical components, their size (surface of about 1 $cm^2$) as well as their focusing distance, and of the electromagnetic detectors, the present positioning systems no longer meet positioning and alignment requirements of the order of a few micrometers between an optical component and a detector.

The object of the invention is to solve such a technical problem by proposing novel systems and a method for positioning and passively aligning at least one optical component as close as possible to an electromagnetic radiation detector.

DISCUSSION OF THE INVENTION

The invention relates to a detector system with an optical function comprising:

an electromagnetic radiation detector including
- a detector portion
- a readout circuit
- hybridization balls and a filling material forming a protruding rim around the detector portion in order to form supporting wedges positioned between this detector portion and this readout circuit, an optical component, and a passive system for positioning and aligning the optical component as close as possible to the electromagnetic radiation detector, which comprises the supporting wedges for Z positioning of the optical component as close as possible to the detector, and X, Y passive alignment means via holding wedges and/or holding balls, the axes X, Y and Z being three axes perpendicular to each other.

The invention also relates to a method for making a detector system with an optical function comprising at least one optical component and one electromagnetic radiation detector including a readout circuit and a detector portion mechanically and electrically connected by means of hybridization balls and a filling material forming a protruding rim on the sides of the detector portion, characterized in that it comprises:

a step for forming supporting wedges for Z positioning of said at least one optical component, a step for introducing holding wedges and/or holding balls between said at least one optical component and the detector in order to allow passive alignment in X, Y, the axes X, Y and Z being three axes perpendicular to each other, a step for positioning and passively aligning said at least one optical component as close as possible to the electromagnetic radiation detector.

In a first embodiment, this method comprises the following steps:

a step for making a protruding rim, a step for mechanically thinning the detector, a selective chemical etching step with which supporting wedges may be created, a step for fixing said at least one optical component with holding balls positioned around the detector individually or collectively.

Advantageously, holding balls may be used as an electrical connection between the optical component and the readout circuit.

In a second embodiment, this method comprises the following steps:

a step for etching grooves at the periphery of the detector, a step for singularizing the detector, a step for hybridizing the detector on a readout circuit via hybridization balls, a step for depositing an underfill between these hybridization balls, a step for mechanically thinning the detector, a selective chemical thinning step with which holding wedges may be created, a step for attaching the optical component.

Advantageously, the step for attaching the optical component comprises the introduction of drops or seam of adhesive.

In a third embodiment, this method comprises the following steps:

a step for epitaxy of an active layer on a substrate after making a "buffer", a hybridization step, a mechanical thinning step, for example a polishing step controlled with regard to its stopping at determined level, a first chemical etching step, a step for depositing a peripheral resin seal, a second chemical etching step, a step for removing the resin seam with a solvent for obtaining a peripheral supporting wedge, a step for depositing at least one optical component with holding balls.

By means of the system and method of the invention, the optical component(s) may be integrated into the cryostat, which allows considerable reduction in the size and weight of a multifunctional electromagnetic radiation detector.

The system and the method of the invention have the following advantages:

a Z control of the positioning of the optical component from 0 to 800 μm with a tolerance of less than +/−10 μm, a controlled in X, Y and θ alignment with a tolerance of less than +/−10 μm, a reduction or even a cancellation, of the weight constraints on the connection or hybridization balls or on the detector and thus a positioning as close as possible to the detector of optical components of consequent weight, an increase in the reliability of the detector by means of robust coupling between the optical component and the detector, an integration of the optical component into the cryostat.

Many industrial applications are possible, for example:

setting into place of lenses, lens arrays, or a system of mobile lenses, setting into place of an attachment or centering system, setting into place of a miniaturized biological module.

The thereby obtained detectors may be used for multiple applications: biology, astronomy, medicine, etc.

SHORT DESCRIPTION OF THE DRAWINGS

DETAILED DISCUSSION OF PARTICULAR EMBODIMENTS

Figure 1:
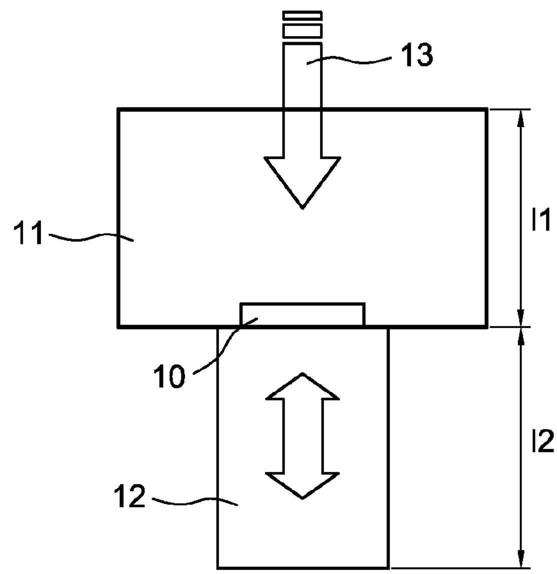
FIG. 1 illustrates a sectional view of a prior art infrared detector in its cryostat.
Figure 2:
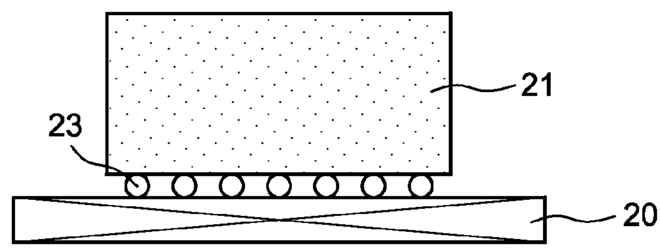
FIG. 2 illustrates a sectional view of a prior art infrared detector assembled by hybridization.
Figure 3A:
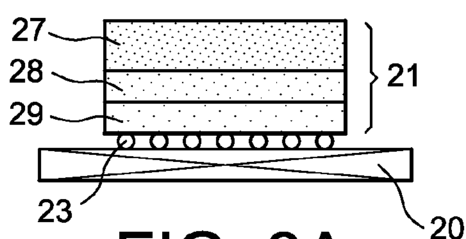
FIGS. 3A and 3B illustrate two different configurations of a detector of the prior art.
Figure 3B:
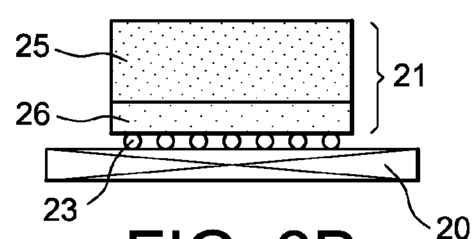
Figure 4:
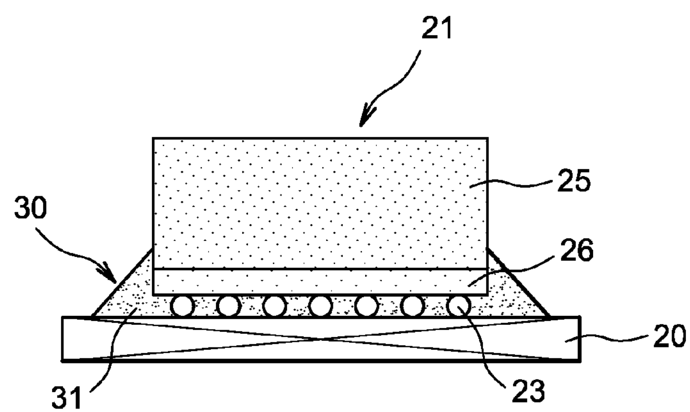
FIGS. 4, 5A and 5B illustrate sectional views of a prior art detector after setting into place an underfill.
Figure 5A:
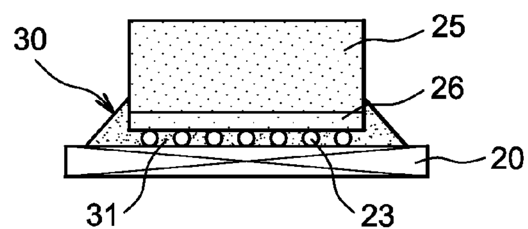
Figure 5B:
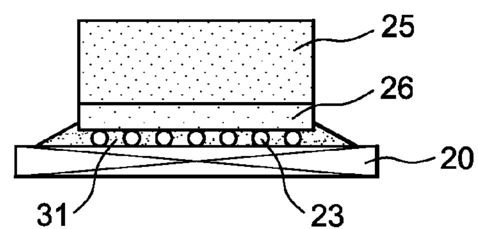
Figure 6A:
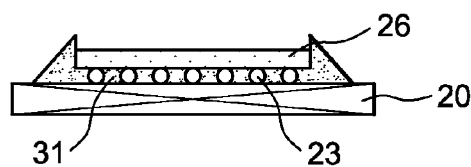
FIGS. 6A and 6B illustrate a sectional view of a prior art detector after thinning, according to two possible configurations: with a protruding rim and without any protruding rim.
Figure 6B:
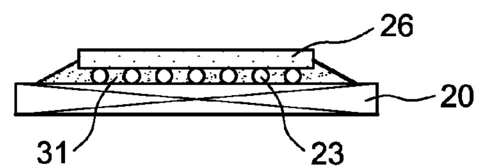
Figure 7:
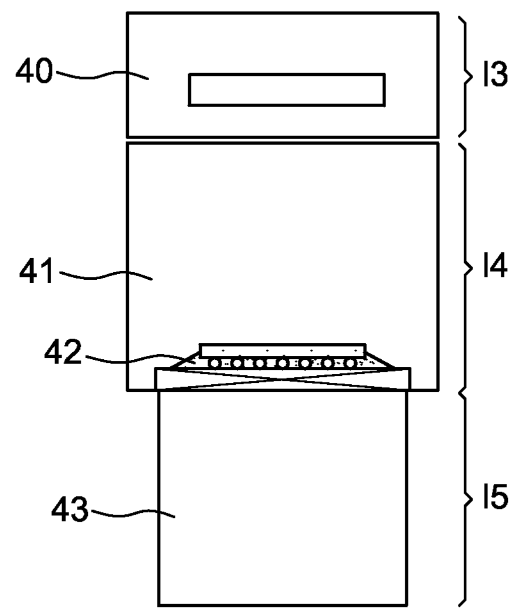
FIG. 7 illustrates a detector with an optical function of the prior art.
Figure 9:
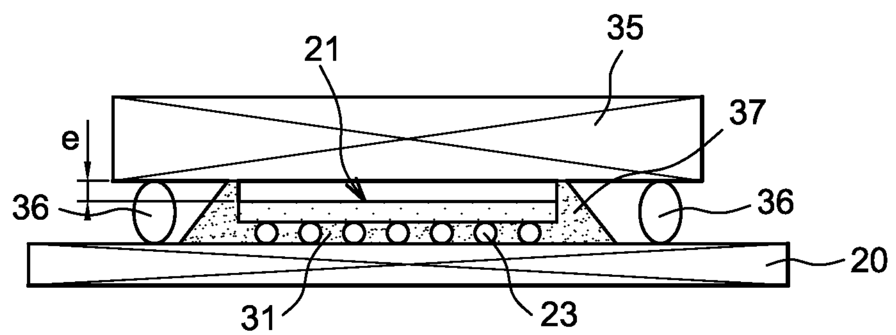
FIGS. 8A-8C and 9 illustrate the steps for making a first embodiment of the invention system as well as the final device obtained.
Figure 9:
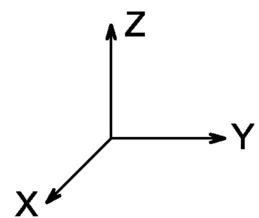

The invention system is a positioning and passive alignment system, i.e. without any adjustment during the positioning of at least one optical component, for example lenses, zooms, etc., as close as possible to a detector, for example at between 0 and 800 μm therefrom. In this system, supporting wedges are used for Z positioning of the optical component as close as possible to the detector, and X and Y alignment means by means of holding wedges and/or holding balls, X, Y and Z being axes perpendicular to each other as illustrated in FIG. 9.

Advantageously, the detector is a cooled infrared detector obtained by a standard manufacturing method.

By means of the invention system, the optical component may be integrated into the cryostat, which allows considerable reduction in the size and weight of a multifunctional electromagnetic radiation detector.

The method for positioning and passively aligning at least one optical component as close as possible to an electromagnetic radiation detector according to the invention therefore comprises:

- a step for forming supporting wedges, for example from a protruding rim, for the Z positioning of said at least one optical component,
- a passive X and Y alignment step by the means of holding wedges and/or holding balls.

The method of the invention has three embodiments.

First Embodiment

Figure 8A:
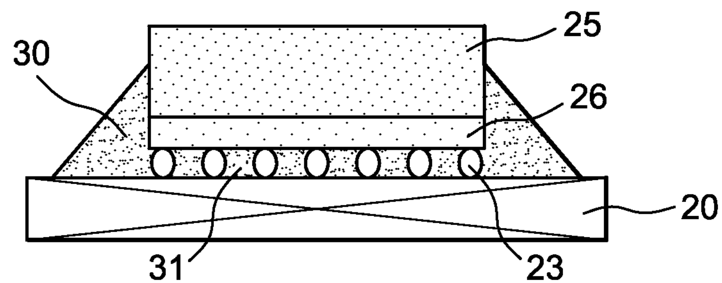
Figure 8B:
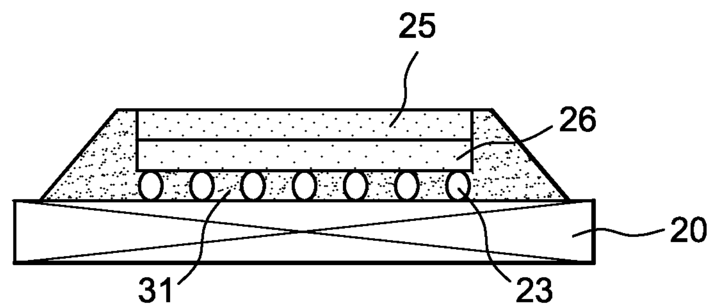

This first embodiment comprises:

- a standard step for making a protruding rim 30, for example of adhesive, as illustrated in FIG. 8A,
- a step for mechanically thinning the detector as illustrated in FIG. 8B, with view to attaching at least one optical component 35 with mechanical balling (supporting balls 36).

In order to achieve this mechanical thinning of the detector up to the intended height (along the Z axis), the height of the hybridization or connection balls 23 (about 10 μm), the height of the detector portion 21 (about 10 μm) and the desired space e between the outer surface of the detector portion 21 and the optical component 35 (about 20 μm) are taken into account in order to determine the height (about 40 μm) at which mechanical thinning should be stopped relatively to the readout circuit 20. This space e may thus be modulated from a few μm to a few hundred μm.

Figure 8C:
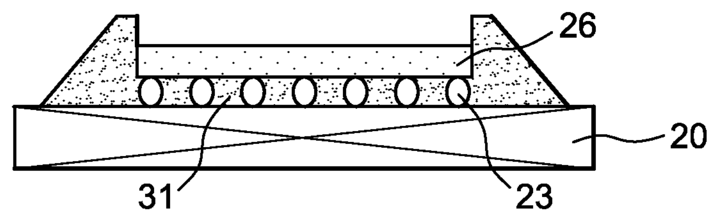

A selective chemical etching step is then carried out, as illustrated in FIG. 8C, which allows etching of the remaining substrate 25 and creating supporting wedges 37 around the detector portion or detector 21 with the protruding rim 30, as illustrated in FIG. 8C. These supporting wedges 37 have a height of about 20 μm relatively to the surface of the detector and of about 40 μm relatively to the readout circuit 20.

A step for attaching the optical component 35 with mechanical balling may then be carried out as illustrated in FIG. 9: holding balls 36 are thus positioned individually or collectively around the detector portion. These holding balls 36 are formed in a flexible material. They allow, while being coupled with a hybridization machine, X and Y self-alignment of the optical component 35 during the hybridization. This self-alignment is accomplished by means of the return forces related to the use of balls, according to minimum energy. These holding balls 36 may also be used as an electric connection between the optical component 35 and the readout circuit 20, which allows positioning of an active optical component.

Holding wedges, other than balls 36, may also be used for external mechanical support or support by an adhesive.

With this first embodiment it is possible to obtain direct advantages:

- Z positioning from a few μm to a few 100 μm with a tolerance of +/−2.5 μm,
- X and Y alignment by means of the holding balls 36 to within +/−0.1 μm,
- reduction of the weight constraint on the connection or hybridization balls 23.

With it, indirect advantages may also be obtained:

- possibility of supplying the optical component 35 with electric power,
- possibility of hermeticity, for example in the case when an adhesive support is achieved.

Second Embodiment

Figure 10A:
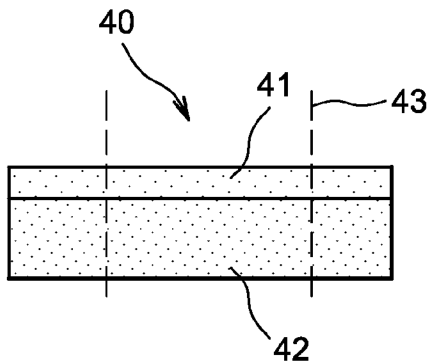
FIGS. 10A-10F, 11A-11D and 12 illustrate the steps for making a second embodiment of the invention system as well as the final device obtained.
Figure 10B:
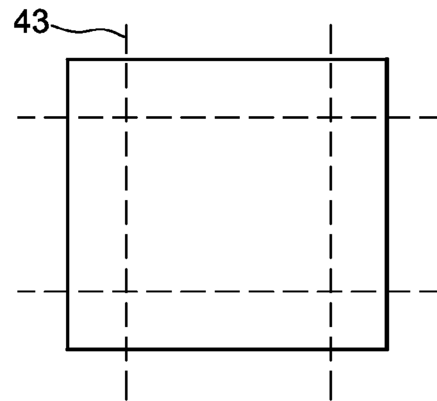
Figure 10C:
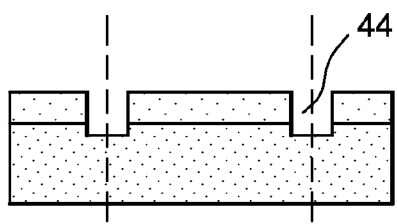
Figure 10D:
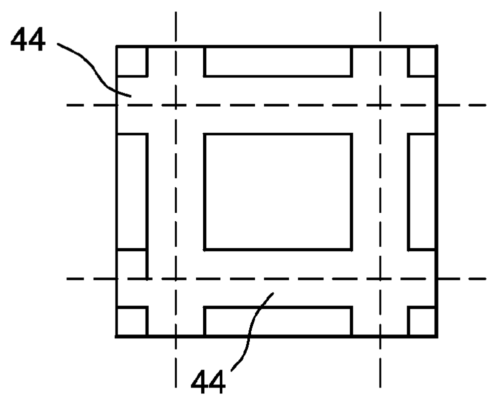

This second embodiment comprises a step for etching "grooves" 44 at the periphery of a detector 40 (for example along two orthogonal directions X and Y). This detector, illustrated in FIGS. 10A and 10B in a sectional view and in a top view (hybridizable face at the top), comprises a substrate 42 and an active portion 41. This etching step, which may be carried out in several ways: etching, plasma etching, etc., as illustrated in FIGS. 10C and 10D, is aligned with the cutting lines 43.

Figure 10E:
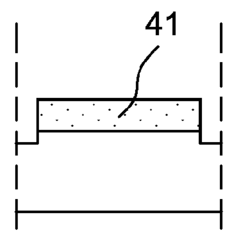
Figure 10F:
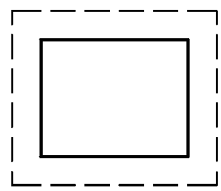

FIGS. 10E and 10F illustrate a subsequent step for singularizing the detector (40) before hybridization, along the cutting lines 43.

Figure 11A:
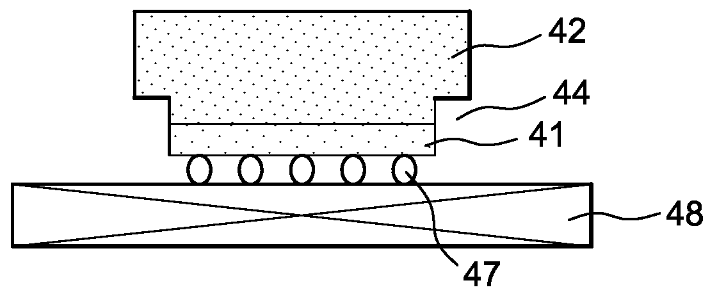
Figure 11B:
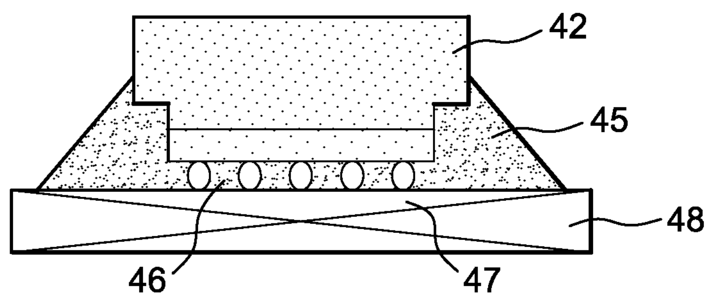
Figure 11C:
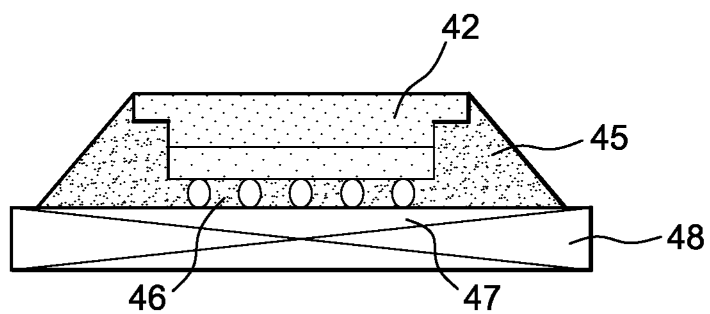
Figure 11D:
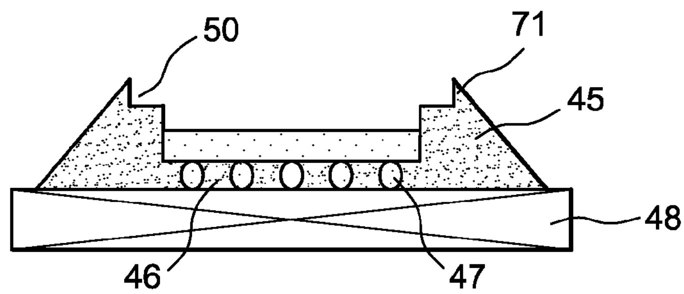

The shaped detector (40) is then recovered, as illustrated in FIGS. 10E and 10F and it is hybridized on the readout circuit 48 according to the flip chip method, as illustrated in FIG. 11A. An underfill 46 is deposited between the connection or hybridization balls 47 on the readout circuit 48 and it moves up by capillarity on the edges of the detector filling the groove formed in this detector as illustrated in FIG. 11B. After polymerization of the underfill, conventional mechanical thinning of the detector is carried out as illustrated in FIG. 11C. After selective chemical thinning, the shape 50 of the groove 44 appears in the protruding rim 45 as illustrated in FIG. 11D.

With the groove 44, it is possible by shape transfer, to create a support for the optical component in the protruding rim 45. Thus, the space, for example of about 20 μm, between the optical component and the surface of the detector, is directly defined by the depth of the groove of about 30 μm minus the thickness of the detector of about 10 μm.

Figure 12:
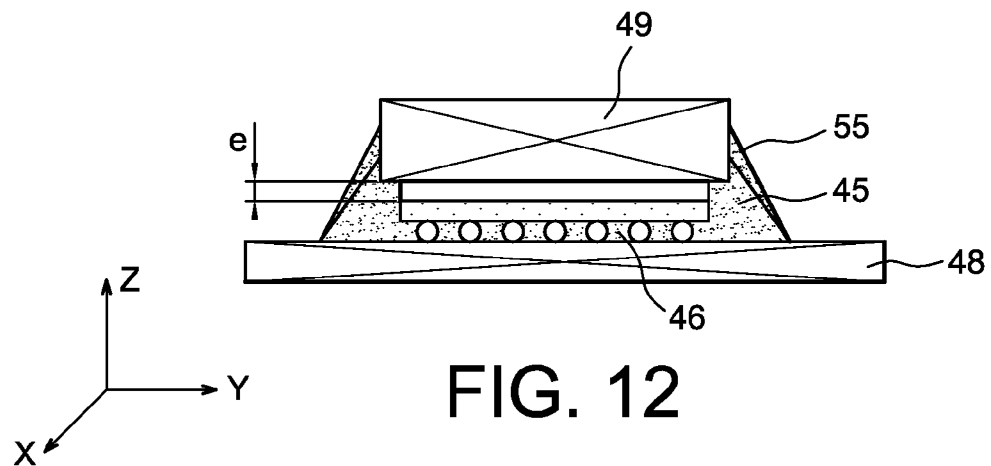

In a step for positioning the optical component 49, the latter will be housed on the support created by the protruding rim 30 as illustrated in FIG. 12, and it may be held at the support by means of adhesive drops or seam 55 for hermeticity.

The groove shape 50 is therefore used as a Z support for the optical component 49. As the underfill 46 has moved up by capillarity after having filled this groove 44, holding wedges 71 are formed along the shape 50 of the groove 44 after chemical thinning. These holding wedges 71 allow X and Y alignment of the optical component 49.

With this second embodiment, it is possible to obtain direct advantages:

- Z positioning e from a few μm to a few 100 μm with a tolerance of +/−2.5 μm,
- alignment in X and Y by means of the holding wedges 71 to within +/−2.5 μm.

With it, indirect advantages may also be obtained:

- identical cutting lines 43 for the optical component 49 and the detector 40,
- rapidity in the making,
- possibility of hermeticity, for example by means of an adhesive seam.

Third Embodiment

Figure 13A:
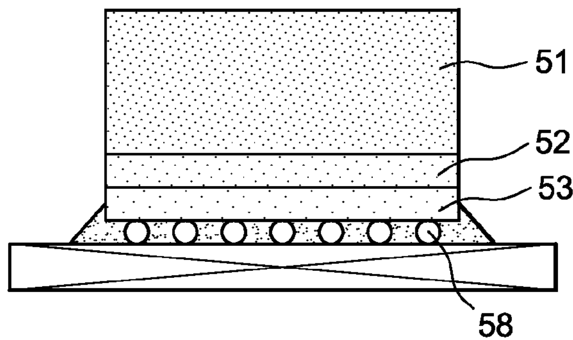
Figure 13B:
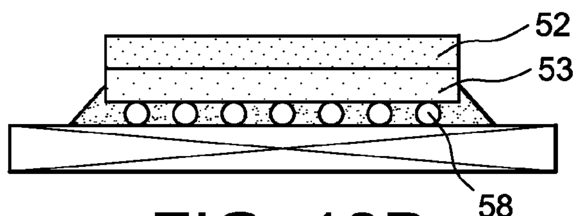
Figure 13C:
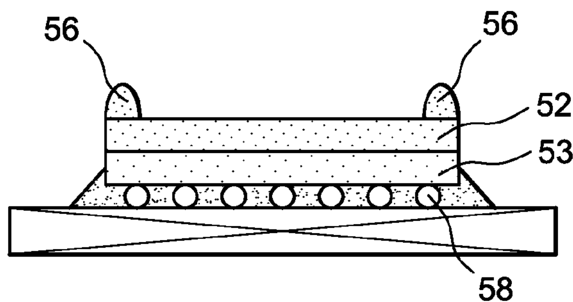
Figure 14A:
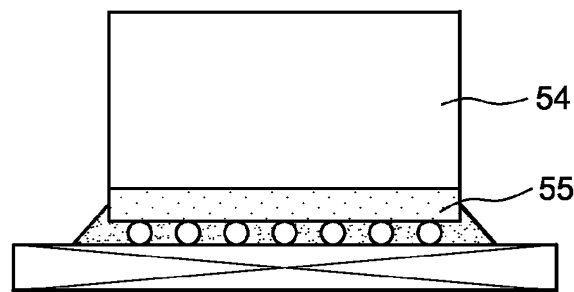
Figure 14B:
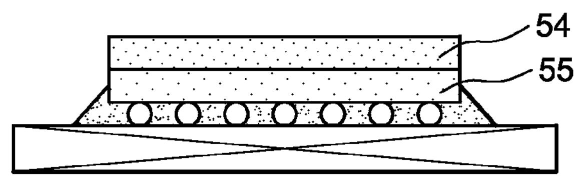
Figure 14C:
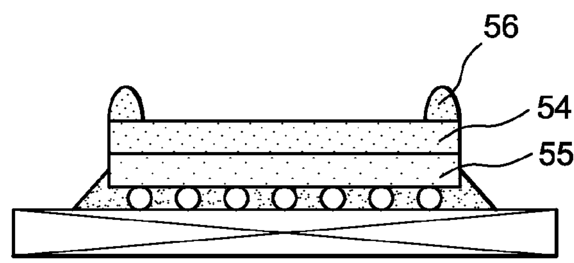

This third embodiment consists of exploiting the architecture of the detector and of the thinning method in order to produce positioning structures intrinsic to the component. FIGS. 13A-13C illustrate this embodiment by using a hetero-substrate (substrate 51+intermediate substrate 52+active portion 53). FIGS. 14A-14C illustrate this embodiment by using a homo-substrate (substrate 54+active portion 55).

The epitaxy of the active layer 53, for example in CdHgTe, of an infrared detection array on a substrate 51 (Ge, for example), is preceded with the making of a growth buffer (intermediate substrate) 52 required for adapting the crystal lattice cell as illustrated in FIG. 13A. Deposited by molecular jets, the buffer 52 has a thickness controlled to within +/−0.1 μm.

Figure 13D:
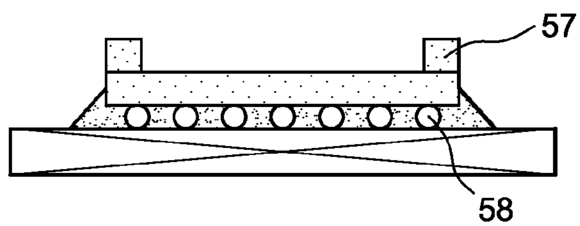

In a step for thinning the detector after a hybridization step, the substrate 51 is removed by a selective chemical route on the buffer as illustrated in FIG. 13B. It is then proceeded with a step for depositing a peripheral resin seam 56, as illustrated in FIG. 13C, before passing to the step for removing the buffer 52 with a selective solution on the material of the active layer 53. During the etching of the latter, its thickness is retained under the resin seam 56, which is then removed with a solvent. The structure shown in FIG. 13D is thereby obtained, consisting of the actual detector (active layer) provided with a peripheral supporting wedge 57 in CdTe, which corresponds to the buffer 52. The thickness of the buffer 52, and therefore of the wedge 57, may vary from 1 μm to 50 μm.

A step for depositing at least one optical component 61 is then carried out. The supporting wedge 57 is therefore used as an Z abutment for the positioning of any optical component useful for the detection system or for the intended application: simple or staged optics or micro-optics, obturators, masks, analyzed objects or useful for analysis, etc.

In the case of a component which would not allow exploitation of selective chemistry, a polishing step is carried out, which is controlled with regard to its stopping at a predetermined level, for example to within +/−2.5 μm. The method is then the one illustrated in FIGS. 14A-14D, in an example of a homo-substrate component with growth on a substrate 54 for example in CdZnTe.

FIG. 14A illustrates the module before thinning;

FIG. 14B illustrates the mechanical thinning step and the first chemical etching step;

FIG. 14C illustrates the step for depositing resin.

Figure 14D:
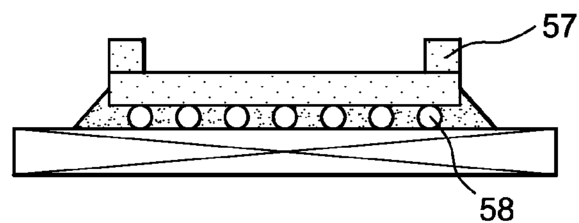

FIG. 14D illustrates the second chemical etching step.

Figure 15:
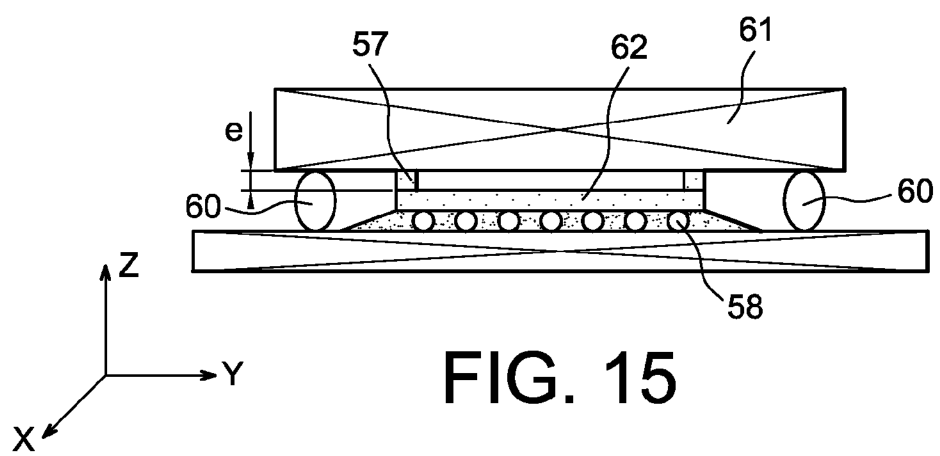
FIGS. 13A-13D, 14A-14D and 15 illustrate the steps for making a third embodiment of the invention system as well as the final device obtained.

As illustrated in FIG. 15, the optical component 61 will then be added onto the detector 62 with holding balls 60.

With this third embodiment it is possible to obtain direct advantages:

- Z positioning e from a few μm to a few 100 μm to within +/−0.1 μm,
- X and Y alignment by means of holding balls 60 to within +/−0.1 μm,
- reduction of the weight constraint on the supporting balls.

Indirect advantages may also be obtained with it:

- possibility of supplying the optical component with electric power,
- possibility of hermeticity.

REFERENCES

[1] FR 2 646 558
[2] FR 2 715 002
[3] U.S. Pat. No. 5,496,769

The invention claimed is:

1. A detector system with an optical function comprising:
   an electromagnetic radiation detector including
      a detector portion (21)
      a readout circuit (20)
      hybridization balls (23) and a filling material forming a protruding rim (30, 45) around the detector portion in order to form supporting wedges (37, 45, 57) positioned between this detector portion and this readout circuit,
   an optical component (35, 49, 61), and
   a system for positioning and passively aligning the optical component with the electromagnetic radiation detector (21), which comprises the supporting wedges (37, 45, 57) configured to contact a leading surface of the optical component, for Z positioning of the optical component (35) by forming a desired void space (e) between the outer surface of the detector portion (21) and the leading surface of the optical component (35) which is less than 800 μm, and means for passive alignment in X, Y by means of holding wedges and/or holding balls (36, 60), placed around the detector portion, and in contact with the leading surface of the optical component, the axes X, Y and Z being three axes perpendicular to each other.

2. The system according to claim 1, wherein the detector is a cooled infrared detector.

3. The system according to claim 2, wherein the optical component is integrated into a cryostat.

4. A method for making a detector system with an optical function comprising at least one optical component (35) and an electromagnetic radiation detector (21) including a readout circuit (20) and a detector portion (21) mechanically and electrically connected by means of hybridization balls (23) and a filling material forming a protruding rim (30) on the sides of the detector portion, characterized in that it comprises:
   a step for forming supporting wedges (37, 57), contacting a leading surface of at least one optical component, for Z positioning of said at least one optical component (35), by forming a desired void space (e) between the outer surface of the detector portion (21) and the leading surface of the optical component (35) which is less than 800 μm,
   a step for introducing holding wedges and/or holding balls (36, 60, 71) contacting a leading surface of the optical component, between the leading surface of the at least one optical component and the detector portion so as to allow passive alignment in X, Y, the X, Y and Z axes being three axes perpendicular between each other, and
   a step for positioning and passively aligning said at least one optical component (35) with the electromagnetic radiation detector.

5. The method according to claim 4, which comprises the following steps:
   a step for making a protruding rim (30) around the detector portion,
   a step for mechanically thinning the detector,
   a selective chemical etching step with which supporting wedges (37) may be created in the protruding rim (30),
   a step for attaching said at least one optical component (35) with holding balls (36) positioned around the detector.

6. The method according to claim 5, wherein during the step for attaching at least one optical component (35) the balls are positioned individually or collectively.

7. The method according to claim 5, wherein the holding balls (36) provide an electric connection between the optical component (35) and the readout circuit (20).

8. The method according to claim 4, which comprises the following steps:
   a step for etching grooves (44) at the periphery of the detector (40),
   a step for singularizing the detector (40),
   a step for hybridizing the detector (40) on a readout circuit (48) via hybridization balls (47), a step for depositing an underfill (46) between these hybridization balls (47), a step for mechanically thinning the detector (40), a selective chemical thinning step with which supporting wedges (50) may be created in the protruding rim (45), and a step for attaching the optical component (49).

9. The method according to claim 8, wherein the step for attaching the optical component comprises the introduction of adhesive drops or seam (55).

10. The method according to claim 4, which comprises the following steps:

a step for epitaxy of an active layer (53) on a substrate (51) after making a buffer (52), a hybridization step, a mechanical thinning step for thinning the detector, a first chemical etching step, a step for depositing a peripheral resin seam (56), a second chemical etching step, a step for removing the resin seam (56) with a solvent for obtaining a peripheral supporting wedge (57) in the buffer (52), a step for depositing at least one optical component (61) with holding balls (60).

11. The method according to claim 10, wherein the mechanical thinning step is a polishing step controlled as regards its stopping at a determined level.

12. A detector system with an optical function comprising:

an electromagnetic radiation detector including:

a detector portion (21), a readout circuit (20), hybridization balls (23) and a peripheral supporting wedge (57) positioned around the detector portion between this detector portion and this readout circuit, an optical component (35, 49, 61), and a system for positioning and passively aligning the optical component with the electromagnetic radiation detector (21), which comprises said peripheral supporting wedge (57) configured to contact a leading surface of the optical component, for Z positioning of the optical component (35) by forming a desired void space (e) between the outer surface of the detector portion (21) and the optical component (35) which is less than 800 μm, and means for passive alignment in X, Y by means of holding wedges (71) and/or holding balls (36, 60) contacting a leading surface of the optical component, placed around the detector portion, the axes X, Y and Z being three axes perpendicular to each other.

13. The system according to claim 1, wherein the supporting wedges further include a shoulder surface, wherein the shoulder surface is parallel to the outer surface of the detector portion.

14. The system according to claim 13, wherein the optical component further includes an optical output face, wherein the optical output face contacts the shoulder surface of the supporting wedges.

15. The system according to claim 14, wherein the shoulder surface is configured to orient the optical output face of the optical component such that the optical output face is parallel with the surface of the detector portion.

* * * * *